United States Patent
Ando et al.

(10) Patent No.: US 7,714,574 B2
(45) Date of Patent: May 11, 2010

(54) SUPERCONDUCTING MAGNET WITH REFRIGERATOR AND MAGNETIC RESONANCE IMAGING APPARATUS USING THE SAME

(75) Inventors: Ryuya Ando, Hitachi (JP); Mitsushi Abe, Hitachinaka (JP); Tsutomu Yamamoto, Hitachi (JP); Tomoo Chiba, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 11/942,037

(22) Filed: Nov. 19, 2007

(65) Prior Publication Data

US 2008/0180100 A1 Jul. 31, 2008

(30) Foreign Application Priority Data

Nov. 20, 2006 (JP) ............................. 2006-312907

(51) Int. Cl.
 *G01V 3/00* (2006.01)
(52) U.S. Cl. ...................................... 324/309; 324/318
(58) Field of Classification Search .......... 324/300–322
 See application file for complete search history.

(56) References Cited

U.S. PATENT DOCUMENTS

| 4,771,256 | A | * | 9/1988 | Laskaris et al. | 335/301 |
|---|---|---|---|---|---|
| 4,782,671 | A | * | 11/1988 | Breneman et al. | 62/51.1 |
| 4,902,995 | A | * | 2/1990 | Vermilyea | 505/211 |
| 4,924,185 | A | * | 5/1990 | Matsutani | 324/319 |
| 4,924,198 | A | * | 5/1990 | Laskaris | 505/211 |
| 4,935,714 | A | * | 6/1990 | Vermilyea | 505/211 |
| 5,045,826 | A | * | 9/1991 | Laskaris | 335/301 |
| 5,329,266 | A | * | 7/1994 | Soeldner et al. | 335/216 |
| 5,508,613 | A | * | 4/1996 | Kotsubo et al. | 324/318 |
| 5,623,240 | A | * | 4/1997 | Sakuraba et al. | 335/216 |
| 5,701,744 | A | | 12/1997 | Eckels et al. | |
| 5,782,095 | A | | 7/1998 | Chen | |
| 6,677,751 | B1 | * | 1/2004 | Marek et al. | 324/318 |
| 6,967,480 | B2 | * | 11/2005 | Nemoto et al. | 324/318 |
| 7,030,613 | B2 | * | 4/2006 | Morita et al. | 324/318 |
| 7,126,335 | B2 | * | 10/2006 | Morita et al. | 324/318 |
| 7,170,377 | B2 | * | 1/2007 | Jiang et al. | 335/216 |
| 7,295,010 | B2 | * | 11/2007 | Fukuda et al. | 324/318 |
| 7,348,777 | B2 | * | 3/2008 | Jiang et al. | 324/318 |
| 7,430,871 | B2 | * | 10/2008 | Strobel | 62/51.1 |

(Continued)

FOREIGN PATENT DOCUMENTS

JP 05-275231 10/1993

(Continued)

*Primary Examiner*—Brij B Shrivastav
*Assistant Examiner*—Dixomara Vargas
(74) *Attorney, Agent, or Firm*—Mattingly & Malur, P.C.

(57) ABSTRACT

A superconducting magnet includes: a superconducting coil for generating a static magnetic field; a refrigerant container for containing the superconducting coil and a refrigerant; a vacuum container for holding the refrigerant container in a vacuum state; a radiation shield between the refrigerant container and the vacuum container; a refrigerator for re-liquidfying the refrigerant; and a dynamic magnetic field shield. The refrigerator includes: first and second regenerative refrigerants. The dynamic magnetic field shield is an electric good conductor and arranged around the first regenerative refrigerant along a motion axis of the first regenerative refrigerant, wherein a direction of the motion axis is aligned with a direction of a magnetic force line of the static magnetic field at the first regenerative refrigerant.

7 Claims, 6 Drawing Sheets

U.S. PATENT DOCUMENTS

| | | | |
|---|---|---|---|
| 7,474,099 B2 * | 1/2009 | Boesel et al. | 324/318 |
| 7,560,932 B2 * | 7/2009 | Fukuda et al. | 324/322 |

FOREIGN PATENT DOCUMENTS

| | | |
|---|---|---|
| JP | 06-069028 | 3/1994 |
| JP | 9-326513 | 12/1997 |
| JP | 10-165388 | 6/1998 |
| JP | 10-213357 | 8/1998 |
| JP | 11-243007 | 9/1999 |
| JP | 2000-266417 | 9/2000 |
| JP | 2001-263844 | 9/2001 |
| JP | 2006-038446 | 2/2006 |

* cited by examiner

FIG. 3C
EXAMPLE

FIG. 3B
EXAMPLE

FIG. 3A
EXAMPLE

FIG. 4C
COMPARISON EXAMPLE

FIG. 4B
COMPARISON EXAMPLE

FIG. 4A
COMPARISON EXAMPLE

SUPERCONDUCTING MAGNET WITH REFRIGERATOR AND MAGNETIC RESONANCE IMAGING APPARATUS USING THE SAME

CROSS REFERENCE TO RELATED APPLICATIONS

This application claims the foreign priority benefit under Title 35, United States Code, §119(a)-(d) of Japanese Patent Application No. 2006-312907, filed on Nov. 20, 2006 in the Japan Patent Office, the disclosure of which is herein incorporated by reference in its entirety.

BACKGROUND OF THE INVENTION

1. Field of the Invention

The present invention relates to a superconducting magnet with a refrigerator and a magnetic resonance imaging apparatus using the same.

2. Description of the Related Art

An MRI (magnetic resonance imaging) apparatus shots images in a physical property and a chemical property of a subject by use of the nuclear magnetic resonance phenomenon experienced when a high frequency pulses is applied to a subject placed in a static magnetic field having homogeneous magnetic density distribution.

Such an MRI apparatus is strongly requested to have an increased performance and miniaturization from view point of wider, higher applications to medical treatments and installations at more medical facilities.

The MRI apparatus capable of generating a strong static magnetic field, which is one of such requirements, is known which includes a superconducting coil for circulate a persistent current and a refrigerant (liquid helium) to maintain a temperature of the superconducting coil lower than a critical temperature. There are many MRIs including a refrigerator for re-liquefying a vaporized refrigerant to suppress a consumption of the refrigerant. As the refrigerator, a regenerative refrigerator (for example, Gifford-McMahon (GM) refrigerator) is known.

The regenerative refrigerator performs a cooling function by use of adiabatic expansion generated by reciprocation motions of a regenerative refrigerant having a large specific heat at ultracold temperatures (for example, HoCu2). Generally, such a regenerative refrigerant is magnetized itself, which distorts the static magnetic field generated in the MRI apparatus as well as the reciprocating motions may cause a periodic variation in evenness of the static magnetic field in an imaging area.

To solve these problems the following technologies are disclosed:

JP 10-165388A discloses a technology in which a canceling coil for canceling distortion in a magnetic field caused by a magnetized regenerative refrigerant is installed and the canceling coil is driven in accordance with displacement to the regenerative refrigerant.

Further, JP 9-326513A discloses a technology in which thin superconducting sheets are laminated and arranged around the regenerative refrigerant to shield the static magnetic field.

Further, JP 2001-263844A discloses a structure in which the regenerative refrigerant is surrounded with an electric good conductor which shields a dynamic magnetic field generated by the reciprocating motion of the regenerative refrigerant.

Further, JP 10-213357A discloses a structure in which a refrigerator is surrounded with a superconducting material of BiPb system (bismuth lead) which shields the dynamic magnetic field.

Further, JP 2000-266417A discloses a structure in which a superconducting coil is wound around an outer circumference of the regenerative refrigerant of the refrigerator to form a closed loop to shield the dynamic magnetic field.

Further, JP 3122539 discloses a structure in which a superconducting material is arranged at a structural member on a side of the superconducting magnet where the refrigerator is mounted to shield the dynamic magnetic field.

SUMMARY OF THE INVENTION

A first aspect of the present invention provides a superconducting magnet comprising: a superconducting coil for circulating a persistent current to generate a static magnetic field; a refrigerant container for containing the superconducting coil and a refrigerant for cooling the superconducting coil below a critical temperature of the superconducting coil; a vacuum container for housing the refrigerant container and holding the refrigerant container in a vacuum state; a radiation shield between an outer surface of the refrigerant container and an inner surface of the vacuum container; a refrigerator for re-liquefying the refrigerant vaporized inside the refrigerant container, comprising: at least two regenerative refrigerant stages including: a first regenerative refrigerant for reciprocating between the outer surface of the refrigerant container and an inner surface of the radiation shield to cool a vaporized refrigerant; and a second regenerative refrigerant for reciprocating between an outer surface of the radiation shield and the inner surface of the vacuum container to cool the radiation shield and the first regenerative refrigerant; and a dynamic magnetic field shield that is an electric good conductor and arranged around the first regenerative refrigerant along a motion axis of the first regenerative refrigerant, wherein a direction of the motion axis is aligned with a direction of a magnetic force line of the static magnetic field at the first regenerative refrigerant.

A second aspect of the present invention provides a magnetic resonance imaging apparatus comprising a superconducting magnet comprising: a superconducting coil for circulating a persistent current to generate a static magnetic field; a refrigerant container for containing the superconducting coil and a refrigerant for cooling the superconducting coil below a critical temperature of the superconducting coil; a vacuum container for housing the refrigerant container and holding the refrigerant container in a vacuum state; a radiation shield between an outer surface of the refrigerant container and an inner surface of the vacuum container; a refrigerator for re-liquefying the refrigerant vaporized inside the refrigerant container, comprising: at least two regenerative refrigerant stages including: a first regenerative refrigerant for reciprocating between the outer surface of the refrigerant container and an inner surface of the radiation shield to cool a vaporized refrigerant; and a second regenerative refrigerant for reciprocating between an outer surface of the radiation shield and the inner surface of the vacuum container to cool the radiation shield and the first regenerative refrigerant; and a dynamic magnetic field shield that is an electric good conductor and arranged around the first regenerative refrigerant along a motion axis of the first regenerative refrigerant, wherein a direction of the motion axis is aligned with a direction of a magnetic force line of the static magnetic field at the first regenerative refrigerant.

Preferably, the dynamic magnetic field shield comprises an aluminum material having a sleeve shape, a superconducting material having a sleeve shape, or a superconducting wire wound in a solenoid.

Preferably, the dynamic magnetic field shield is arranged between the outer surface of the refrigerant container and an inner surface of the radiation shield.

Preferably, another dynamic magnetic field shield is further arranged on a side of the inner surface of the refrigerant container.

Thus, although the first regenerative refrigerant generates a dynamic magnetic field because the first regenerative refrigerant is magnetized and reciprocates, flowing directions of eddy currents induced in the dynamic magnetic field shield may be limited to a peripheral portion of the axis of the reciprocating.

Accordingly, because the induced eddy currents may not concentrate at the upper and lower portions of the magnetic field shield, a shield effect may not decrease if the magnetic field shield is shortened in the axial direction.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Prior to describing an embodiment of the present invention, the above-mentioned related art will be further argued.

In the technology disclosed in JP 10-165388A, drive control is difficult.

Further, in the technology disclosed in JP 9-326513A, a thickness of the shield will be increased as the superconducting magnet has a stronger magnetic field. Further, the magnetic field generated by the shield itself may adversary affect evenness of the static magnetic field.

Generally, if all surroundings of the object are not covered for such the shield for the dynamic magnetic field, the shield cannot perfectly exhibit a shielding effect. However, the refrigerator for the superconducting magnet has a restriction in which upper and lower parts thereof cannot be enclosed because of the structure of the refrigerator itself or mounting the refrigerator on the superconducting magnet.

In this case, a size of the shield necessary for sufficiently providing the shielding performance for the dynamic magnetic field may generally become large to secure a passage of an eddy current of induced currents. Particularly, this may increase a size in an axial direction of the refrigerator, restrict a degree of freedom in designing the apparatus, or increase a cost.

The present invention is developed to solve the above-described problems and to provide a miniaturized superconducting magnet apparatus and a miniaturized magnetic resonance imaging apparatus in which a static magnetic field intensity substantially does not vary while the refrigerator for re-liquefying the refrigerant in the superconducting coil obtains a high quality image.

First Embodiment

With reference to drawings will be described a magnetic resonance imaging apparatus (hereinafter, referred to as a vertical magnetic field type of MRI apparatus).

Figure 1A:
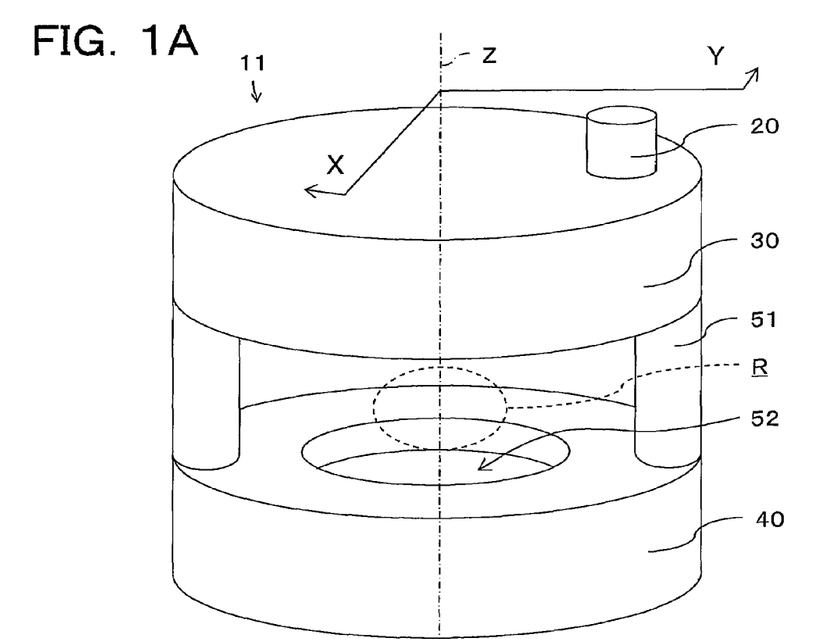
FIG. 1A is a perspective view of a magnetic resonance imaging apparatus according to a first embodiment of the present invention.
Figure 1B:
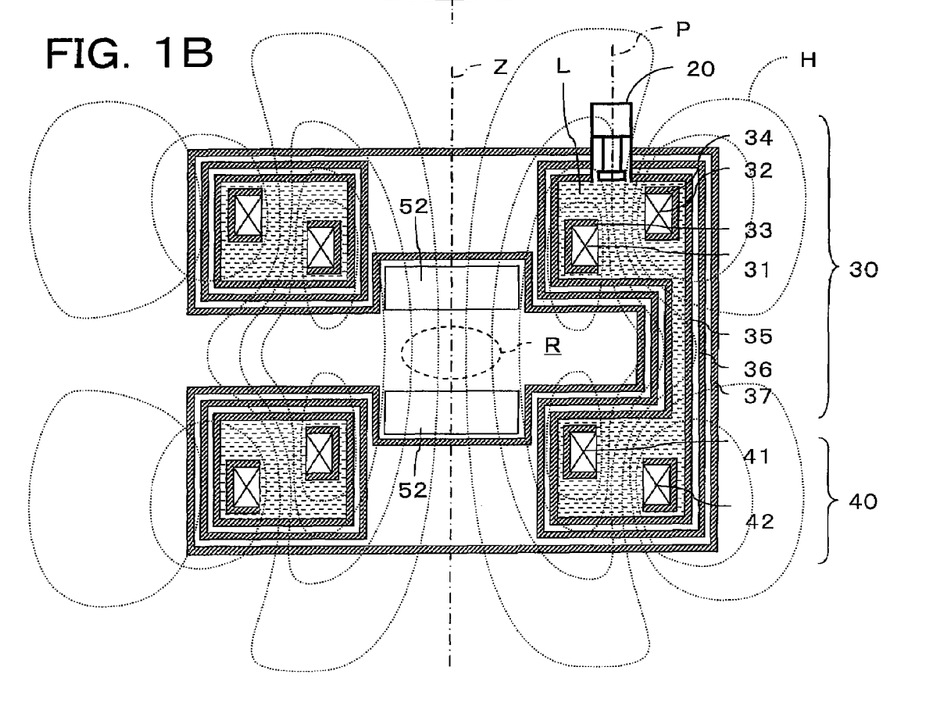
FIG. 1B is a cross section view, taken along line X-Y, of the magnetic resonance imaging apparatus shown in FIG. 1A.

As shown in FIGS. 1A and 1B, the vertical magnetic field type of MRI apparatus 11 includes a first superconducting magnet 30, gradient magnetic field generators 52, and a second superconducting magnet 40, which are arranged to have a central axis Z thereof as a rotational symmetrical axis, which is directed in the vertical direction, and further includes a refrigerator 20 and supporting members 51.

In the vertical magnetic field type of MRI apparatus 11, the first and second superconducting magnets 30 and 40 are arranged in the vertical direction to have a pair structure to provide a region (imaging region R) where a static magnetic field is generated with a homogeneous magnetic flux density at a center of the gap between the first and second superconducting magnets 30 and 40. After insertion of a subject (not shown) in the gap, tomographic images of the subject in the imaging region R are shot using a magnetic resonance phenomenon.

The vertical magnetic field type of MRI apparatus 11 further includes a bed for inserting the subject into the imaging region R, an RF (Radio Frequency) coil for radiating a high frequency pulses toward the imaging region R, a receiving coil for receiving a response signal from the imaging region R, a controller for controlling these units, and an operation unit for generating, displaying, and analyzing tomographic images of the subject from the response signal (all are not shown).

The gradient magnetic field generators 52, as shown in FIG. 1B showing an X-Y cross section, are arranged on surfaces opposing to each other through the central axis Z of a vacuum container 37. The gradient magnetic field generators 52 apply a gradient magnetic field to a static magnetic field H generated by the superconducting magnets 30 and 40 to provide positional information of a region where the magnetic resonance phenomenon occurs.

The first superconducting magnet 30 includes, as shown in FIG. 1B, a first shield coil 32, a first main coil 31, a refrigerant container 35, a radiation shield 36, and a vacuum container 37, at least.

The second superconducting magnet 40 includes a second main coil 41, a second shield coil 42, the refrigerant container 35, the radiation shield 36, and the vacuum container 37, at least.

The supporting members 51 support the first and second superconducting magnets 30 and 40 mainly in the vertical direction to have a mirror symmetric arrangement in which the central axis Z are shared between the first and second superconducting magnets 30 and 40. Insides of the supporting members 51 are formed to have communications between the refrigerant containers 35, the radiation shields 36, and the vacuum containers 37 of the first and second superconducting magnets 30 and 40.

The first and second superconducting magnets 30 and 40 generate a static magnetic field H around the central axis Z in a space between the first and second superconducting magnets 30 and 40 (dotted lines indicates magnetic force lines in FIG. 1B) in which the magnetic flux density is homogeneous in the imaging region R.

The first main coil 31 wound around a coil bobbin 33 (second main coil 41) is a superconducting coil for circulating a persistent current therethrough to generate the static magnetic field H for measurement in the imaging region R in which a superconducting wire is wound around the coil bobbin 33 arranged in which a central axis thereof is aligned with the central axis Z.

The superconducting coil is a coil whose an electric resistance becomes zero when a status thereof transients from a normal conducting state to a superconducting state by being cooled under a critical temperature with the refrigerant filled in the refrigerant container 35. This allows a current to permanently circulate therethrough without decrease.

The first shield coil 32 wound around a coil bobbin 34 (second shield coil 42) is formed to have a diameter greater than the first main coil 31 (second main coil 41) and arranged in which the center line thereof is aligned with the central axis Z together with the first main coil 31 (second main coil 41). The first shield coil 32 (second shield coil 42) allows a circular current to flow therethrough in a direction opposite to that in the first main coil 31 (second main coil 41). Thus, the first shield coil 32 (second shield coil 42) cancels a part of the magnetic filed for the measurement, which is externally leaked from the first and second superconducting magnet 30 and 40.

The radiation shield 36 is provided between an outer surface of the refrigerant container 35 and an inner surface of the vacuum container 37 to shield heat radiated from the vacuum container 37 to the refrigerant container 35.

The vacuum container 37 keeps inside thereof in a vacuum state and holds the refrigerant container 35 therein in the vacuum state to prevent heat from entering the refrigerant container 35 by transmission and convection.

The refrigerant container 35 is a container for containing the first and second main coils 31 and 41, the shield coils 32 and 42 (superconducting coils), and a refrigerant L for cooling these superconducting coils under the critical temperature.

The refrigerant container 35 includes a pair of torus containers arranged in the vertical direction substantially symmetrically, the torus containers communicating with each other through the supporting members 51 (having the same inside structure as the torus containers). Thus, the refrigerant container 35 cools the superconducting coils arranged therein under the critical temperature to bring the superconducting coils therein in a superconducting state.

The refrigerator 20 re-liquefying the refrigerant vaporized in the refrigerant container 35 in which an axis of reciprocating motion (motion axis P) of a first regenerative refrigerant 21 (see FIG. 2) is substantially aligned with directions of the magnetic force lines (denoted with dotted lines in FIG. 1B) of the static field H shown in FIG. 1B.

In FIG. 1B, for example, the refrigerator 20 is arranged at a location where the magnetic force lines go vertically downward and positioned so that the motion axis P (see FIG. 2) is aligned with the direction of the central axis Z. However, the present invention is not limited to this example, but the refrigerator 20 may be arranged with inclination to the central axis Z as long as the direction of the motion axis P is substantially aligned with the direction of the magnetic force lines of the static magnetic field H at the location thereof.

Figure 2:
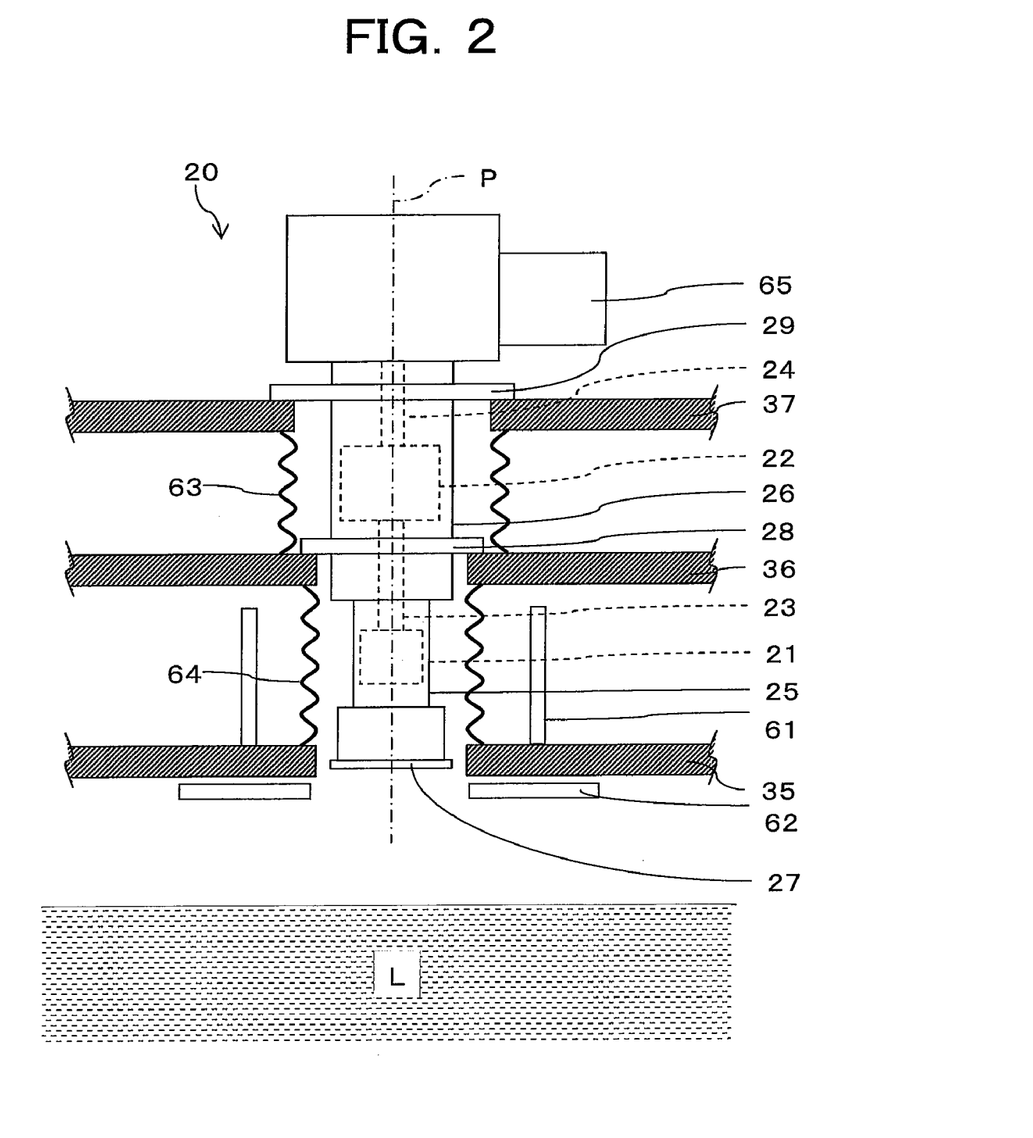
FIG. 2 is an enlarged side view, partially a cross section view, of a mounting place of a refrigerator used in the magnetic resonance imaging apparatus and a superconducting magnet apparatus according to the first embodiment.

As FIG. 2 shows an enlarged view of a mounting portion of the refrigerator 20, the refrigerator 20 is inserted through openings provided in the vacuum container 37, the radiation shield 36, the refrigerant container 35 from an atmospheric side to allow a third flange 29 to be fixed to the vacuumed container 37.

Gaps between openings of the vacuum container 37, the radiation shield 36, and the refrigerant container 35 are sealed with bellows 63 and 64. This structure prevents the vacuum state of the vacuum container 37 from being broken while the refrigerator 20 is installed.

The refrigerator 20 converts a rotation motion of a drive motor 65 into a reciprocation motion through a second connecting member 24. Thus, a second regenerative refrigerant 22, connected to the second connecting member 24, reciprocates together with the first regenerative refrigerant 21 connected thereto through a first connecting member 23.

The first regenerative refrigerator 21 reciprocates between an outer surface of the refrigerant container 35 and an inner surface of the radiation shield 36. More specifically, the first regenerative refrigerant 21 reciprocates in the first cylinder 25 with a top dead center at a position adjacent to the second flange 28 and a bottom dead center at a position adjacent to the first flange 27.

This cools the first flange 27 locating at a lower part inside the first cylinder 25 to re-liquefy vaporized refrigerant L in contact with the first flange 27.

The regenerative refrigerant material of the first regenerative refrigerant 21 is required to have a large specific heat around an operation temperature (a liquefying temperature of a vaporized refrigerant, 4K in the case of He) to obtain a superior cooling performance. More specifically, an intermetallic compound of a rare earth element such as Er (erbium) and Ho (holmium) and the like is formed in small balls, having a diameter smaller than 1 mm, which are packed. As mentioned above, reciprocating the first regenerative refrigerant 21 provides a temperature decrease for example, from 80K (a temperature of the second flange 28) to approximately 2K (a temperature of the first flange 27).

The second regenerative refrigerant 22 reciprocates in the second cylinder 26 between the outer surface of the radiation shield 36 and an inner surface of the vacuum container 37. More specifically, the second regenerative refrigerant 22 reciprocates in the second cylinder 26 with a top dead center at a position adjacent to the third flange 29 and a bottom dead center at a position adjacent to the second flange 28. As mentioned above, reciprocating the second regenerative refrigerant 22 provides a temperature decrease, for example, from a room temperature (a temperature of the third flange 28) to approximately 80 K (a temperature of the second flange 28). In other words, heat inside the refrigerant container 35 is carried to the side of the drive motor 66.

Among materials for the second regenerative refrigerant 22, copper and stainless steel which are formed in grids laminated are usable.

Inside the second cylinder 26, the second regenerative refrigerant 22 cools the second flange 28 under the second regenerative refrigerant 22 by an adiabatic expansion effect and cools the radiation shield 36 in contact with the second flange 28.

Thus, the radiation shield 36 above the first cylinder 25 is cooled. This makes transmission of heat accompanied by the expansion and compression smooth, with an improved cooling power of the second flange 28.

The first dynamic magnetic field shield 61 is an electric good conductor arranged around and extending along the motion axis P of the first regenerative refrigerant 21 between the outer surface of the refrigerant container 35 and the inner surface of the radiation shield 36 (extending from the outer surface of the refrigerant container 35 toward the radiation shield 36). The first dynamic magnetic field shield 61 is provided in a vacuum region. This prevents the first dynamic magnetic field shield 61 from serving as a heat transmission pass, which suppresses a decrease in a cooling capacity of the refrigerator 20.

A second dynamic magnetic field shield 62 is an electric good conductor arranged on an inner side of the refrigerant container 35 (refrigerant side) around the motion axis P of the first regenerative refrigerant 21. The second dynamic magnetic filed shield 62 assists a function of the first dynamic magnetic field shield 61.

Figure 7:
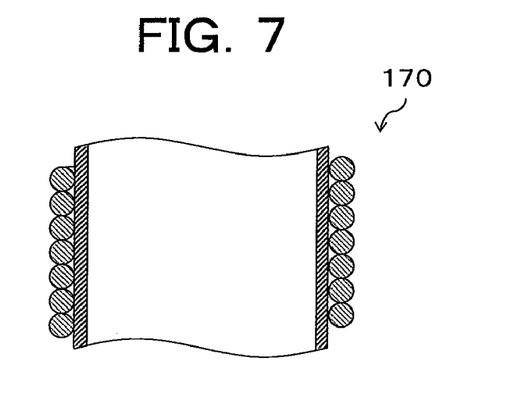
FIG. 7 is a cross section view of a solenoid coil according the first and second embodiments.

As the dynamic magnetic filed shields 61 and 62, an aluminum material formed in a sleeve, a superconducting material formed in a sleeve, and a superconducting wire wound as a solenoid 170 (see FIG. 7) of which both ends are connected to each other (shorted) are usable.

Figure 3A:
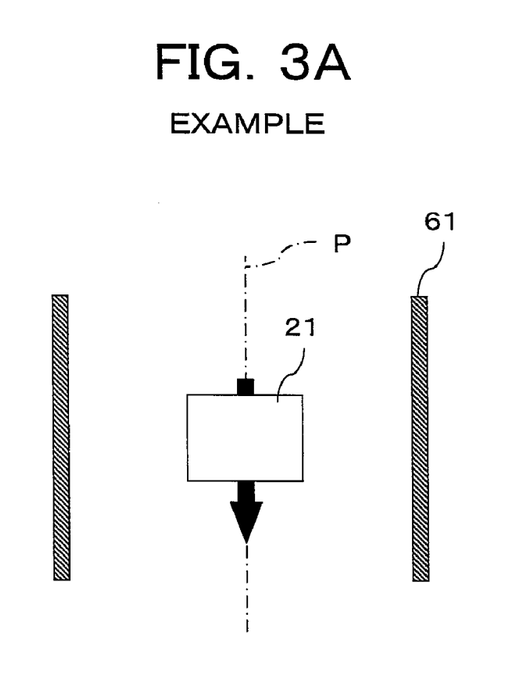
FIGS. 3A and 3B are illustrations for describing eddy currents induced in a dynamic magnetic field shield member used in the embodiments of the present invention.
Figure 3B:
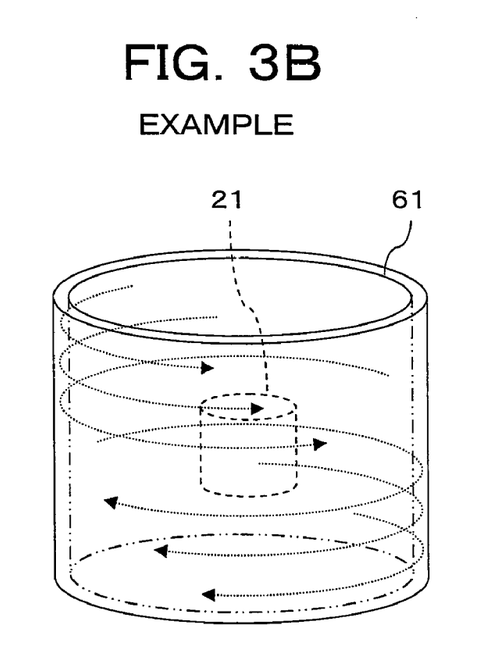
Figure 3C:
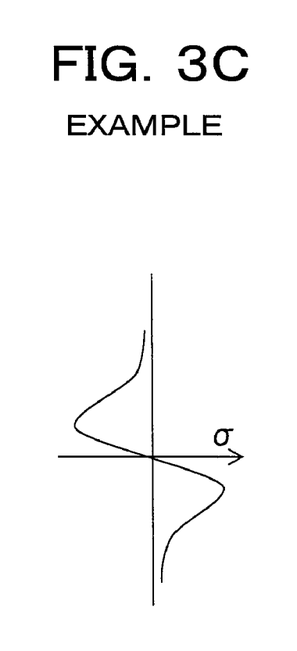
FIG. 3C is a chart for showing a current density distribution of the eddy currents in an example according to the embodiments of the present invention.

With reference to FIGS. 3A to 3C, will be described a function of the first dynamic magnetic shield 61 to which the present invention is applied (see FIG. 2 as needed). These drawings show an example of the first embodiment in which only the first regenerative refrigerant 21 and the first dynamic magnetic filed shield 61 are shown and others are omitted.

FIG. 3A shows the case where the superconducting magnet has the structure shown in FIG. 2. In other word, FIG. 3A shows the case where the motion axis P of the first regenerative refrigerant 21 is substantially aligned with a direction (an arrow FIG. 3A) of magnetization of the first regenerative refrigerant 21.

FIG. 3B shows eddy currents (dotted lines with arrows) induced in the first dynamic magnetic field 61 by the vertical reciprocating motion of the first regenerative refrigerant 21. Thus, the passages of the eddy currents induced in the first dynamic magnetic field shield 61 are formed around the motion axis P.

FIG. 3C shows a distribution of current density σ of eddy currents flowing across an elevation cross section of the first regenerative refrigerant 21. The induced eddy currents circulate around the motion axis P without local concentration, and at places remote from the first regenerative refrigerant 21 intensities of induced currents are small. This provides a distribution in which the current density σ of eddy currents is small at upper and lower ends of the first dynamic magnetic field shield 61.

Thus, it is considered that shortening a dimension of the first dynamic magnetic field shield 61 in the direction of the motion axis P does not directly result in decrease in a shielding effect to the dynamic magnetic field.

Figure 4A:
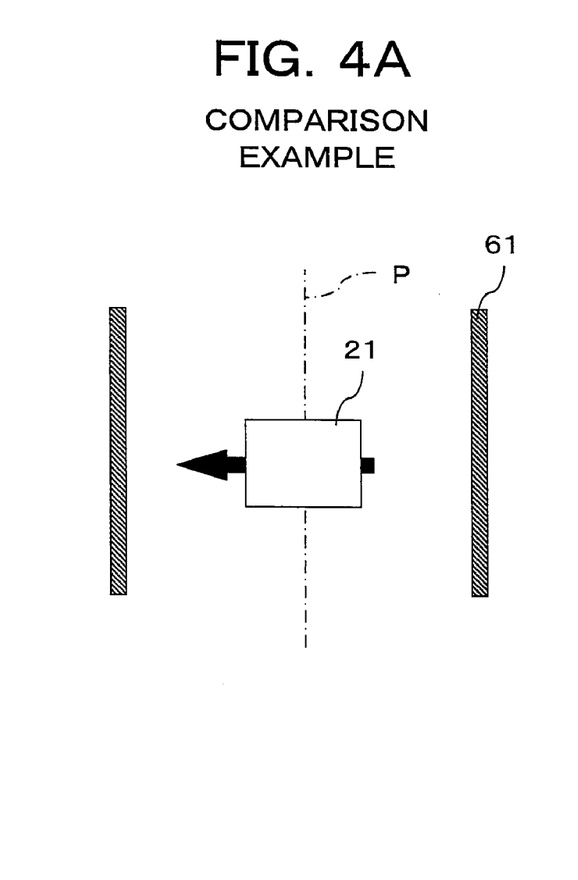
FIGS. 4A and 4B are illustrations for describing eddy currents induced in a comparison example of a dynamic magnetic field shield according to the present invention.
Figure 4B:
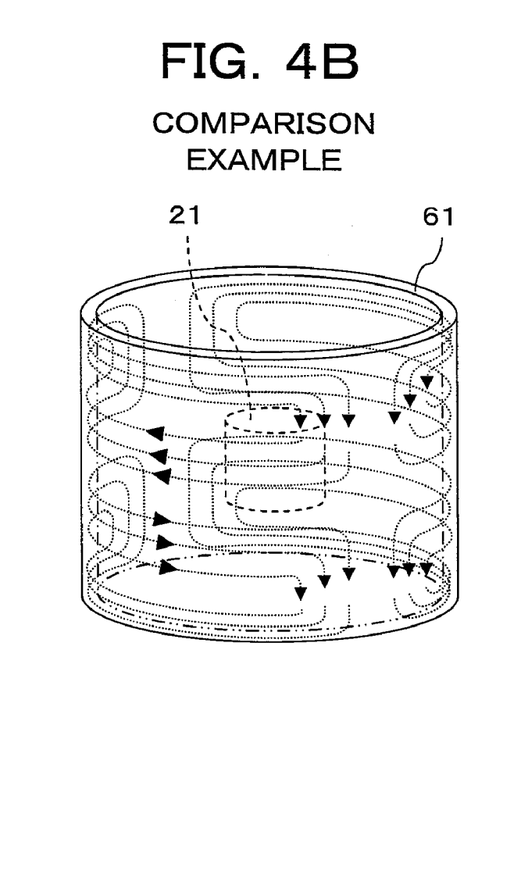
Figure 4C:
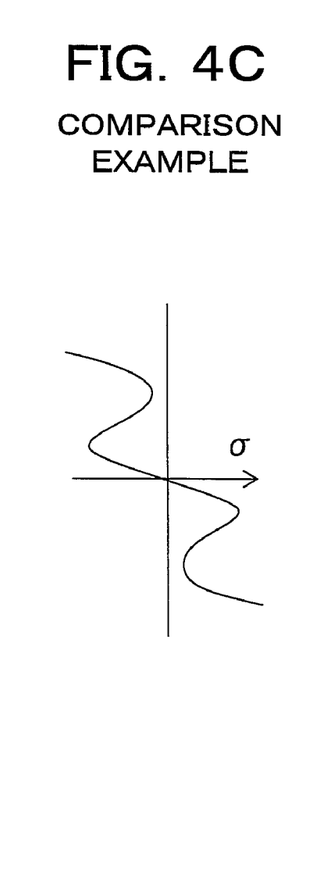
FIG. 4C is a chart for showing a current density distribution of the eddy currents in the comparison example shown in FIGS. 4A and 4B.

FIGS. 4A to 4C show a comparison example in the case in which the motion axis P of the first regenerative refrigerant 21 is not aligned with the direction of magnetization of the first regenerative refrigerant 21.

FIG. 4A shows a case where the magnetizing direction of the first regenerative refrigerant 21 intersects approximately orthogonally with the motion axis P of the first regenerative refrigerant 21. Here, there will be considered only the orthogonal component (an arrow in FIG. 4A) of the static magnetic field H inclined to the motion axis P for simplicity.

FIG. 4B shows flows (dotted lines) of eddy currents induced in the first dynamic magnetic field shield 61 by the vertical reciprocation of the first regenerative refrigerant 21 in the comparison example. This shows that passages of the eddy currents induced in the first magnetic field shield 61 form four loops with different circulation directions.

FIG. 4C shows a distribution of a current density σ of eddy currents flowing across an elevation cross section of the first regenerative refrigerant 21 in the comparison example. If it is assumed that the length in the direction of the motion axis P of the first dynamic magnetic filed shield 61 is insufficient, the induced eddy currents locally concentrate at the upper and lower ends of the first dynamic magnetic shield 61 because sufficient passages of the eddy currents are not provided with a result that a current density σ of the eddy current is large at the upper and lower ends. Such a distribution of the current density σ is caused by the restriction in the passage of the eddy currents, which provides an undesirable magnetic field distribution.

Thus, if the dimension of the first dynamic magnetic field shield 61 is shortened in the motion axis P, the current density σ of the eddy currents further increases at the upper and lower ends, with decrease in the shielding effect of the dynamic magnetic field.

Though detailed descriptions are omitted, this is applicable to the second dynamic magnetic field shield 62. In other words, approximately aligning the direction of the motion axis P of the first regenerative refrigerant 21 with a magnetized direction (the arrows in FIG. 3) of the regenerative refrigerant 21 provides a maximum shielding effect of the dynamic magnetic filed.

Thus, as shown in FIG. 1B, the refrigerator 20 is arranged to make the direction of the static field H (see FIG. 1B) aligned with the motion axis P of the first regenerative refrigerant 21, which can maximize the shielding performance of the dynamic magnetic field. This suppresses dimensions of the superconducting magnet in the direction of the motion axis P with miniaturization of the superconducting magnet and the magnetic resonance imaging apparatus.

Second Embodiment

Figure 5A:
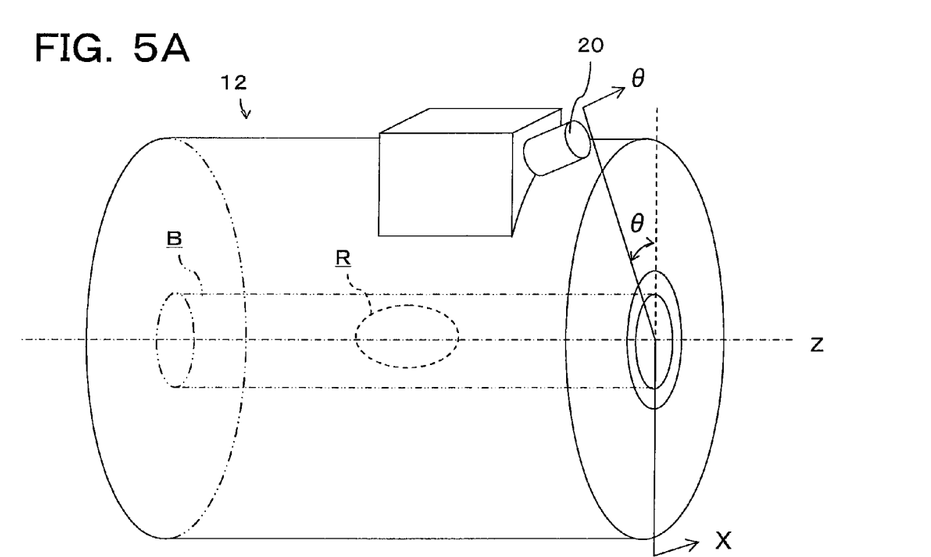
FIG. 5A is a perspective view of a magnetic resonance imaging apparatus according to a second embodiment of the present invention.
Figure 5B:
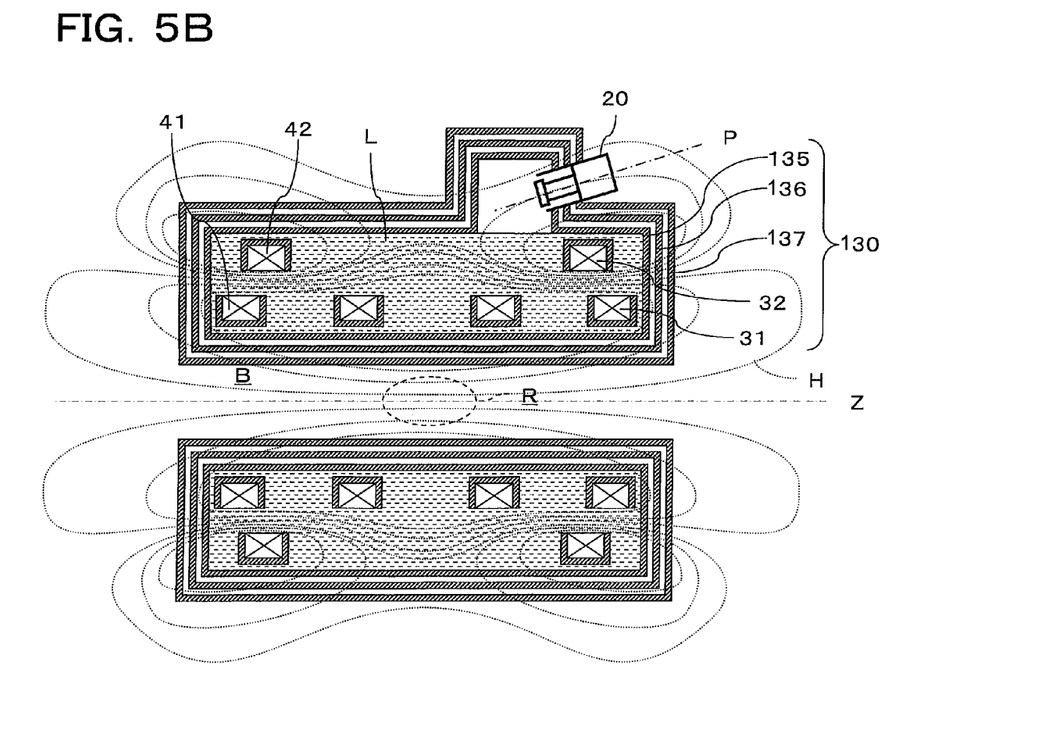
FIG. 5B is a cross section view, taken along line X-θ, of the magnetic resonance imaging apparatus shown in FIG. 5A.

With reference to FIGS. 5A and 5B, will be described a magnetic resonance imaging apparatus (hereinafter referred to as a horizontal magnetic field type MRI apparatus) of a second embodiment according to the present invention. The magnetic resonance imaging apparatus according to the second embodiment has substantially the same structure as that according to the first embodiment. Main differences between the first and second embodiments are that: the central axis Z is horizontal; the refrigerator 20 is mounted on a circumferential surface of the superconducting magnet 130; and a vacuum container 137, a radiation shield 136, and a refrigerant container 135 provide a single sleeve shape container without the supporting member 51 in the first embodiment. The first and second main coils 31 and 41 and first and second shield coils 32 and 42 are similar to those in the first embodiment to provide the imaging region R where the magnetic flux density is homogeneous.

More specifically, FIG. 5A shows a perspective view of the horizontal magnetic field type MRI apparatus 12. The horizontal magnetic field type of MRI apparatus 12 comprises the superconducting magnet 130 having a central axis Z of rotation horizontally arranged and the refrigerator 20.

The superconducting magnet 130 has a bore B which also has the central axis Z of rotation to provide a region at the center of the bore B (imaging region R) where magnetic force lines of a static magnetic field are directed in a horizontal direction with a homogeneous magnetic flux density distribution. A subject (not shown) is inserted into the bore B and a tomographic image of the subject in the imaging region is shot using the magnetic resonance phenomenon.

The horizontal magnetic field type MRI apparatus 12 further includes a gradient magnetic field generator, a bed for inserting the subject into the imaging region R, an RF (Radio Frequency) coil for radiating a high frequency pulses toward the imaging region R, a receiving coil for receiving a response signal from the imaging region R, a controller for controlling these units, and an operation unit for generating, displaying, and analyzing tomographic images of the subject from the response signal (all are not shown).

The horizontal magnetic field type MRI apparatus 12 has a structure as shown in FIG. 5B of an X-θ cross section in which among elements shown in FIG. 5B earlier mentioned ones are designated with the same references, and thus a duplicated description will be omitted.

Here, FIG. 5B shows the superconducting coils for generating the static magnetic field H for measurement in the imaging region R such that the first main coil 31 and a second main coil 41 are separately designated for simplicity. Actually four coils are arranged at both ends. However, the first main coil 31 and the second main coil 41 are representatively shown, wherein the first main coil 31 and the second main coil 41 are provided using the same parts, and the number thereof may be unlimited thereto.

The refrigerator 20 is arranged at a position shifted from a top to have an acute angle θ between a vertical line intersecting the central axis Z and a line intersecting the location and the central axis Z. This arrangement suppresses a head space which the horizontal magnetic field type MRI apparatus 12 occupies.

Further, as shown in FIG. 5B, the refrigerator 20 is arranged slantwise with the acute angle between the motion axis P thereof and the central axis Z of the superconducting magnet 30. This arrangement allows the motion axis P to be substantially aligned with the direction of the magnetic force lines of the static magnetic field H. The position of the refrigerator 20 shown in FIGS. 5A and 5B are exemplarily shown, and the location is unlimited as long as the motion axis P at the location is aligned with the direction of the magnetic force lines of the static magnetic field H at the location.

FIGS. 5A and 5B, provided on a mounting place of the refrigerator 20 is a protruding portion protruding from a circumferential surface of the superconducting magnet 130, which has a space therein to introduce a vaporized gas of the refrigerant L. However, such a space may be omitted.

Figure 6:
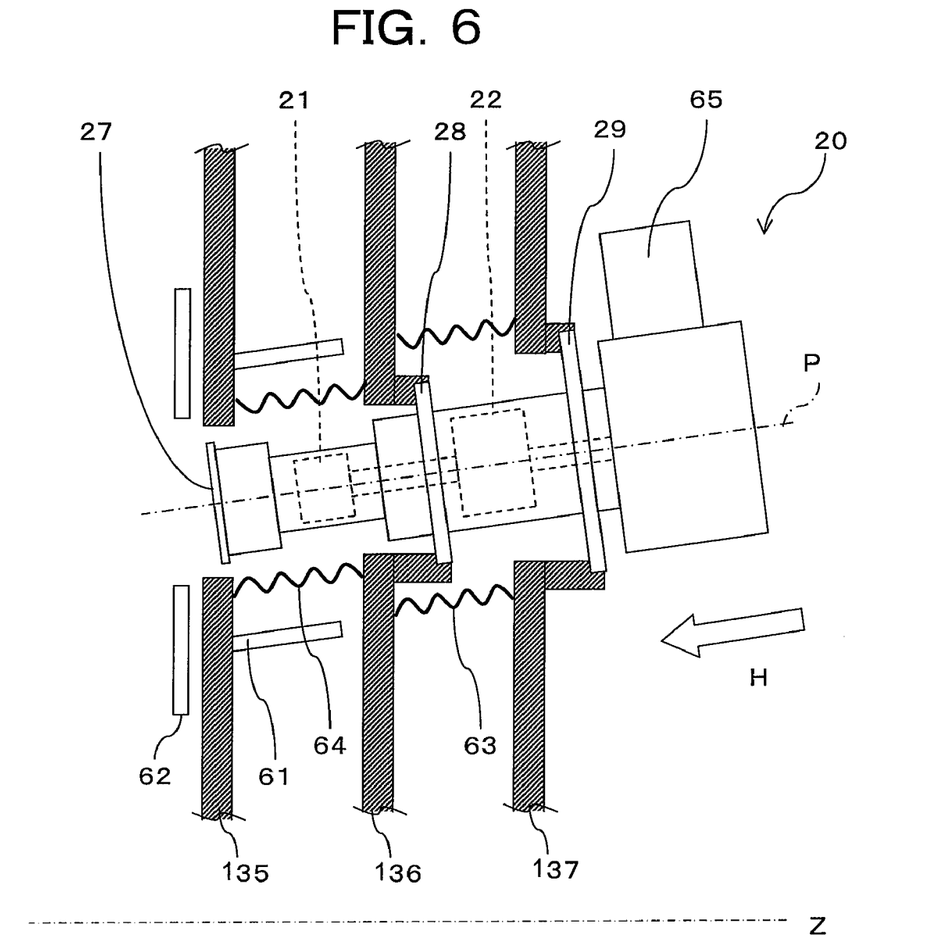
FIG. 6 is an enlarged side view, partially a cross section view, of a mounting place of a refrigerator used in the magnetic resonance imaging apparatus or a superconducting magnet apparatus according to the second embodiment.

FIG. 6 shows an enlarged side view of the refrigerator 20 of the second embodiment.

The refrigerator 20 is inclined from the horizon (the central axis Z) to be directed to the direction of magnetic force lines of the static magnetic field H, and further the first dynamic magnetic field shield 61 is arranged to be inclined from the central axis Z to extend in parallel with the motion axis P of the regenerative refrigerant 21.

Such an arrangement of the first dynamic magnetic field shield 61 allows eddy currents to be induced around the axis of the first dynamic magnetic field shield 61, which can improve a shielding effect to the dynamic magnetic filed. However, the first dynamic magnetic field shield 61 may be arranged horizontally irrespective of such an improvement.

In the second embodiment, an example is shown in which the refrigerator 20 is arranged to be inclined from the central axis Z to be directed in a direction of the magnetic force lines of the static magnetic field H. However, there may be another way of obtaining a location where the magnetic force lines are aligned with the direction of the central axis Z and arranging the refrigerator 20 at the location in which the motion axis P is aligned with the central axis Z.

In the first and second embodiments, the number of the refrigerator 20 is one on one MRI apparatus. However, a plurality of the refrigerators may be provided in accordance with a required cooling power. Further, in the drawings the first flange 27 which is a cooling part of the refrigerator 20 is located in a space where the refrigerant vaporizes. However, the refrigerator 20 may be arranged to be in contact with a surface of liquid of the refrigerant or to be submerged in the liquid.

The invention claimed is:

1. A superconducting magnet comprising:
   a superconducting coil for circulating a persistent current to generate a static magnetic field;
   a refrigerant container for containing the superconducting coil and a refrigerant for cooling the superconducting coil below a critical temperature of the superconducting coil;
   a vacuum container for housing the refrigerant container and holding the refrigerant container in a vacuum state;
   a radiation shield between an outer surface of the refrigerant container and an inner surface of the vacuum container;
   a refrigerator for re-liquefying the refrigerant vaporized inside the refrigerant container, comprising: at least two regenerative refrigerant stages including:
   a first regenerative refrigerant for reciprocating between the outer surface of the refrigerant container and an inner surface of the radiation shield to cool a vaporized refrigerant; and
   a second regenerative refrigerant for reciprocating between an outer surface of the radiation shield and the inner surface of the vacuum container to cool the radiation shield and the first regenerative refrigerant; and
   a dynamic magnetic field shield that is an electric good conductor and arranged around the first regenerative refrigerant along a motion axis of the first regenerative refrigerant, wherein a direction of the motion axis is aligned with a direction of a magnetic force line of the static magnetic field at the first regenerative refrigerant.

2. The superconducting magnet as claimed in claim 1, wherein the dynamic magnetic field shield comprises an aluminum member having a sleeve shape.

3. The superconducting magnet as claimed in claim 1, wherein the dynamic magnetic field shield comprises a superconducting material having a sleeve shape.

4. The superconducting magnet as claimed in claim 1, wherein the dynamic magnetic field shield comprises a superconducting wire wound in a solenoid.

5. The superconducting magnet as claimed in claim 1, wherein the dynamic magnetic field shield is arranged between the outer surface of the refrigerant container and an inner surface of the radiation shield.

6. The superconducting magnet as claimed in claim 1, wherein the dynamic magnetic field shield is arranged on a side of the inner surface of the refrigerant container.

7. A magnetic resonance imaging apparatus comprising:
   a superconducting magnet according to claim 1.

* * * * *